(12) United States Patent
Lee et al.

(10) Patent No.: US 6,399,417 B1
(45) Date of Patent: Jun. 4, 2002

(54) METHOD OF FABRICATING PLATED CIRCUIT LINES OVER BALL GRID ARRAY SUBSTRATE

(75) Inventors: Wen Cheng Lee, Taichung; Chih-Chin Liao, Chang hua, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/837,959

(22) Filed: Apr. 19, 2001

(30) Foreign Application Priority Data

Mar. 6, 2001 (TW) .......................................... 90105094

(51) Int. Cl.[7] ............................................. H01L 21/44
(52) U.S. Cl. ........................................ 438/106; 125/612
(58) Field of Search ................................ 438/612, 106, 438/15, 109, 125, 128

(56) References Cited

U.S. PATENT DOCUMENTS

| | | | | |
|---|---|---|---|---|
| 5,639,695 A | * | 6/1997 | Jones et al. | 438/126 |
| 5,708,567 A | * | 1/1998 | Shim et al. | 361/723 |
| 6,020,637 A | * | 2/2000 | Karnezos | 257/738 |
| 6,127,726 A | * | 10/2000 | Bright | 257/691 |
| 6,214,645 B1 | * | 4/2001 | Kim | 438/110 |
| 6,323,058 B1 | * | 11/2001 | Murakamz | 438/106 |

* cited by examiner

*Primary Examiner*—David Nelms
*Assistant Examiner*—Thao P Le
(74) *Attorney, Agent, or Firm*—Peter F. Corless; Steven M. Jensen; Edwards & Angell, LLP

(57) ABSTRACT

A method is proposed for the fabrication of plated circuit lines, including contact fingers, electrically-conductive traces, and solder-ball pads, over an BGA (Ball Grid Array) substrate. The method is characterized by that contact fingers, electrically-conductive traces, and solder-ball pads on the BGA substrate are interconnected with provisional bridging lines; and then, each integrally-connected group of the contact fingers, the electrically-conductive traces, and the solder-ball pads is connected via a branched plating line to a common plating bus. During plating process, the plating electrical current can be applied to the plating bus and then distributed over these branched plating lines to all of the contact fingers and the solder-ball pads. Finally, a drilling process is performed to break all the provisional bridging lines into open-circuited state. Compared to the prior art, since the proposed method requires no use of etchant during the drilling process, it would cause no contamination to the substrate surfaces. Moreover, the proposed method allows the use of a reduced layout area for the circuit lines and can help reduce mutual inductive interference among the circuit lines.

7 Claims, 3 Drawing Sheets

METHOD OF FABRICATING PLATED CIRCUIT LINES OVER BALL GRID ARRAY SUBSTRATE

BACKGROUND OF THE INVENTION

1. Field of the Invention

This invention relates to BGA (Ball Grid Array) semiconductor packaging technology, and more particularly, to a method of fabricating a set of plated circuit lines, including contact fingers, electrically-conductive traces, and solder-ball pads, over a BGA substrate.

2. Description of Related Art

BGA (Ball Grid Array) is an advanced type of semiconductor packaging technology which is characterized by the use of a substrate as chip carrier whose front side is used for mounting one or more semiconductor chips and whose back side is provided with a grid array of solder balls. During SMT (Surface Mount Technology) process, the BGA package can be mechanically bonded and electrically coupled to an external printed circuit board (PCB) by means of these solder balls.

A BGA substrate typically has a front surface formed with a plurality of contact fingers and electrically-conductive traces and a back surface formed with a plurality of solder-ball pads which are electrically connected through vias to the electrically-conductive traces on the front surface. Each of the contact fingers together with its connected electrically-conductive trace and solder-ball pad, connote a circuit lie for external connection. Traditionally, in order to allow these circuit lines to have increased bondability and electrically conductivity, they are typically plated with nickel and gold (Ni/Au).

A conventional method of fabricating plated circuit line over a BGA substrate is illustratively depicted in the following with reference to FIGS. 1A–1C (note that FIGS. 1A–1C are simplified schematic diagrams showing only a small number of components related to the invention for demonstrative purpose and which are not drawn to actual sizes and scales in practical applications; the actual circuit layout may be much more complex).

Referring to FIGS. 1A–1B, this conventional BGA package includes: (a) a substrate 110 whose front surface is used to mount a semiconductor chip 120, and whose back surface is used to mount a ball grid array 130 (since the semiconductor chip 120 and the ball grid array 130 are to be mounted later, they are shown in dotted lines in FIG. 1A); (c) a plurality of contact fingers 140 provided on the front surface of the substrate 110 and ground the semiconductor chip 120 to serve as electrical-connecting points for the semiconductor chip 120; (d) a plurality of electrically-conductive traces 150, which are provided on the front surface of the substrate 110 and electrically connected to the contact fingers 140; (e) a plurality of solder-ball pads 160 provided on the back surface of the substrate 110; (f) a plurality of electrically-conductive vias 170 in the substrate 110 for electrically connecting the solder-ball pads 160 to the electrically-conductive traces 150.

In addition, in order to facilitate a plating process on the contact fingers 140, and the solder-ball pads 160, a common plating bus 180 is ,provided on the substrate 110, which includes a plurality of branched plating lines 191 connected respectively to each of the electrically-conductive traces 150.

During plating process, the plating electrical current can be applied to the plating bus 180 and then distributed over the branched plating lines 181 to each of the contact fingers 140 and the solder-ball pads 160.

Referring further to FIG. 1C, as the plating process is completed, it is then required to break each of the branched plating lines 181 from the plating bus 180 by means of a cutting blade (not shown).

One drawback to the forgoing circuit layout scheme, however, is that, for each of the electrically-conductive traces 150, it is required to provide a dedicated branched plating line. In the case of FIGS. 1A–1C, for example, since there are five electrically-conductive traces 150, it is required to provide a total of 5 branched plating lines 181, which would make the layout design work quite difficult in routability. Moreover, such a great number of the branched plating lines 181 would cause mutual inductive interference therebetween, undesirably degrading the electrical performance of the signal transmission over these circuit lines.

One conventional method to break the branched plating lines 181 from the plating bus 180 is to perform a selective substrate etch-back process in which a corrosive etchant and a photoresist mask are used to etch back into the jointed portions between the plating bus 180 and the branched plating lines 181.

One drawback to the forgoing method, however, is that the etchant being used in the etch-back process would easily cause contamination to the substrate surface, which would adversely degrade the quality of the resulted package assembly on the substrate. Moreover, the disposal of the waste etchant after use would be a problem that is environmentally-unfriendly. Still one drawback to the forgoing method is that, since the points selected for etch-back are restricted to some areas only, it would cause the circuit lines to be lengthily routed over the BGA substrate, undesirably increasing the required layout area.

One solution to the foregoing problem is to utilize the so-called Gold Pattern Plating (GPP) technology, which allows the use of no branched plating lines over the BGA substrate, so that the above-mentioned drawbacks are resolved. The GPP technology is well-known in the semiconductor industry, so description thereof will not be further detailed.

One drawback to the utilization of the GPP technology, however, is that, after the contact fingers 140 and the solder-ball pads 160 have been gold-plate it would nevertheless require the use of corrosive etchant for subsequent pattern definition to form the electrically-conductive traces 150, undesirably causing contamination to the gold-plated contact fingers 140 and the solder-ball pads 160, thus degrading the quality of subsequent wire bonding and solder ball implantation over gold-plated contact fingers 140 and the solder-ball pads 160. In addition, since the, GPP technology is highly complex in process which includes repetitive masked pattern definition steps, its implementation is highly cost-ineffective, roughly 1.3 to 1.5 times more costly than the use of other technologies.

The ROC Invention Patent No. 388970, published on May 1, 2000, teaches the use of laser means to break apart integrally-connected circuit lines into individual ones. This method, however, is considerably costly to implement since the required laser equipment is quite expensive to purchase.

SUMMARY OF THE INVENTION

It is therefore an objective of this invention to provide a new method of fabricating plated circuit lines over BGA substrate, which would cause no contamination to the contact fingers and the solder-ball pads, so as to allow the finished BGA package more assured in quality and reliability.

It is another objective of this invention to provide a new method of fabricating plated circuit lines over BGA substrate, which allows the use of a reduced layout area for the circuit lines and also allows high routability.

It is still another objective of this invention to provide a new method of fabricating plated circuit lines over BGA substrate, which is more convenient and cost-effective to implement than the prior art.

In accordance with the foregoing and other objectives, the invention proposes a new method of fabricating plated circuit lines over BGA substrate.

The method of the invention is characterized by that contact fingers, electrically-conductive traces, and solder-ball pads on the BGA substrate are interconnected with provisional bridging lines; and then, each integrally-connected group of the contact fingers, the electrically-conductive traces, and the solder-ball pads is connected via a branched plating line to a common plating bus. During plating process, the plating electrical current can be applied to the plating bus and then distributed over these branched plating lines to all of the contact fingers and the solder-ball pads. Finally, a drilling process is performed to break all the provisional bridging lines into open-circuited state.

Compared to the prior art, since the invention requires no use of etchant during the drilling process, it would cause no contamination to the substrate surfaces. The utilization of the invention is therefore more environmentally friendly and can make the finished BGA package more assured in quality and reliability. Moreover, the invention allows the use of a reduced layout area for the circuit lines and can help reduce the mutual inductive interference among the circuit lines.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The method according to the invention for fabricating plated circuit lines over BGA substrate is disclosed in fill details by way of preferred embodiments in the following with reference to FIGS. 2A–2C and FIGS. 3A–3C (note that FIGS. 2A–2C and FIGS. 3A–3C are simplified schematic diagrams showing only a small number of components related to the invention for demonstrative purpose and which are not drawn to actual sizes and scales in practical applications; the actual circuit layout may be much more complex).

Figure 2A:
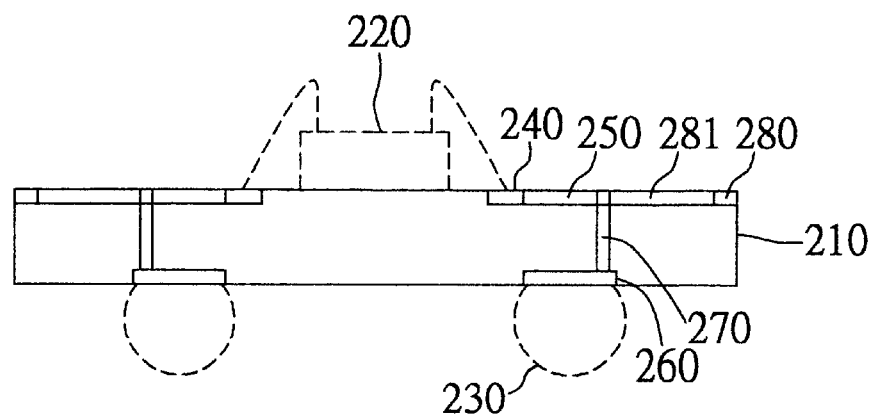
FIG. 2A is a schematic sectional diagram showing a BGA package that utilizes the invention.
Figure 2B:
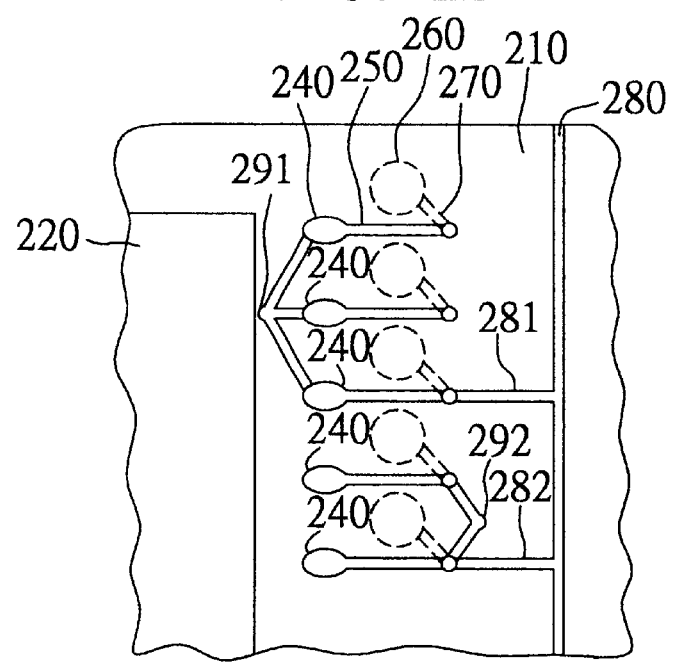
FIG. 2B is a schematic diagram showing the top view of an example of circuit layout scheme for the realization of the invention.

Referring to FIGS. 2A–2B, this conventional BGA package includes: (a) a substrate 210 whose front surface is used to mount a semiconductor chip 220, and whose back surface is used to mount a ball grid array 230 (since the semiconductor chip 220 and the ball grid array 230 are to be mounted later, they are shown in dotted lines in FIG. 2A); (c) a plurality of contact fingers 240 provided on the front surface of the substrate 210 and around the semiconductor chip 220 to serve as electrical-connecting points for the semiconductor chip 220; (d) a plurality of electrically-conductive traces 250, which are provided on the front surface of the substrate 210 and electrically connected to the contact fingers 240; (e) a plurality of solder-ball pads 260 provided on the back surface of the substrate 210; (f) a plurality of electrically-conductive vias 270 in the substrate 210 for electrically connecting the solder-ball pads 260 to the electrically-conductive traces 250.

In addition, in order to facilitate a plating process on the contact fingers 240, and the solder-ball pads 260, a common ping bus 280 is provided on the substrate 210.

Figure 2C:
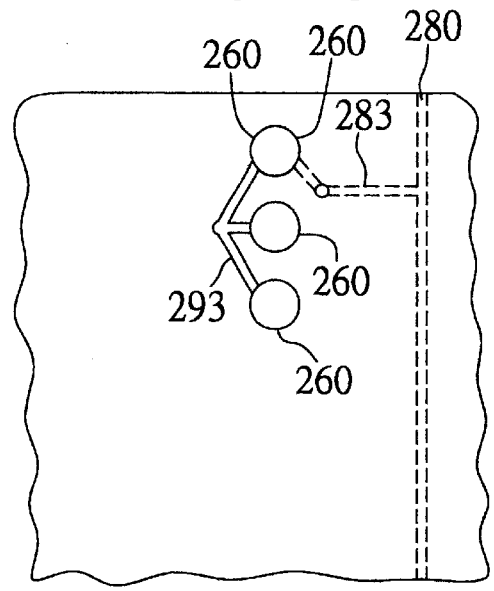
FIG. 2C is a schematic showing the top view of another example of circuit layout scheme for the realization of the invention.

It is a characteristic feature of the invention that the contact fingers 240, the solder-ball pads 260, and the electrically-conductive vias 270 are interconnected in such a manner that part or all of the contact fingers 240 are connected together to a first provisional bridging line 291 (as illustrated in FIG. 2B); or that part or all of the electrically-conductive vias 270 are connected together to a second provisional bridging line 292 (as illustrated in FIG. 2B); or part or all of the solder-ball pads 260 are connected together to a third provisional bridging line 293 (as illustrated in FIG. 2C); and then, one of those contact fingers 240 that are connected to the first provisional bridging line 291 is connected via a first branched plating line 281 to the plating bus 280, while one of the electrically-conductive vias 270 that are connected to the second provisional bridging line 292 is connected via a second branched plating line 282 to the plating bus 280, and while one of those solder-ball pads 260 that are connected to the third provisional bridging line 293 is connected via a third branched plating line 283 to the plating bus 280.

During plating process, the plating electrical current can be applied to the plating bus 280 and then distributed over the branched plating lines 281, 282, 283 to all of the electrically-conductive traces 250 and the electrically-conductive vias 270 and subsequently to all of the contact fingers 240 and the solder-ball pads 260.

Figure 1A:
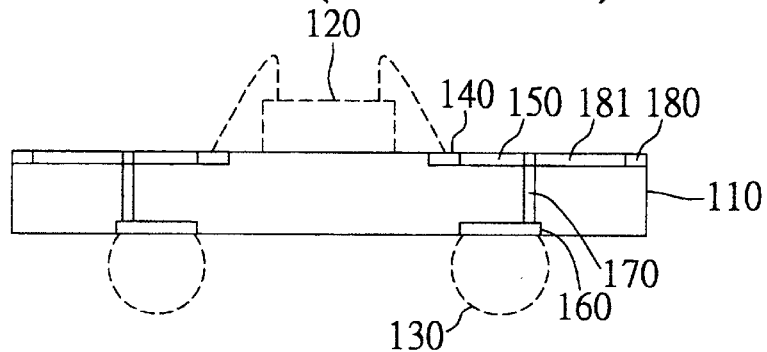
FIG. 1A (PRIOR ART) is a schematic sectional diagram showing a conventional BGA package.
Figure 1B:
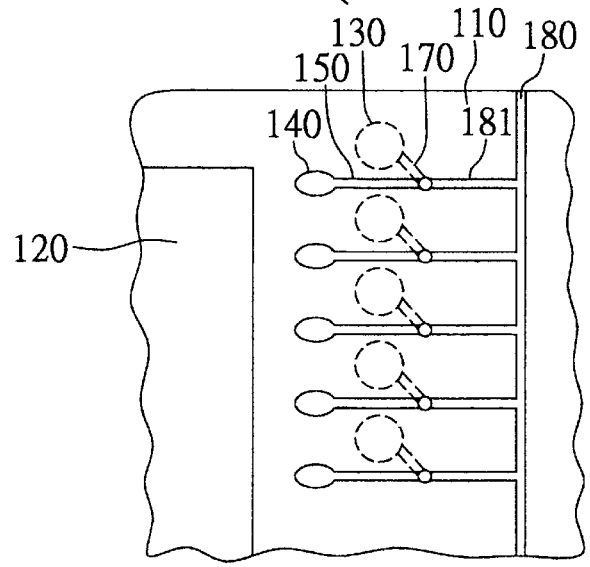
FIG. 1B (PRIOR ART) is a schematic diagram showing the top view of a conventional circuit layout scheme on the BGA substrate.
Figure 1C:
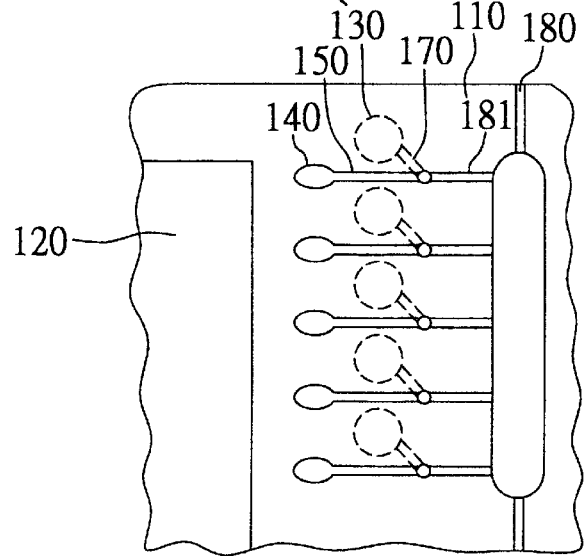
FIG. 1C (PRIOR ART) shows the same of FIG. 1C except when the branched plating lines have been broken apart from the common plating bus.

Comparing FIG. 2B with FIG. 1B, it can be seen that the invention is more advantageous than the prior art in that the invention needs just two branched plating lines for five electrically-conductive traces, rather than five branched plating lines for five electrically-conductive traces as in the case of the prior art. Therefore, the invention can undoubtedly reduce the level of difficulty in the routability of the circuit lines and allow a reduction in the mutual inductive interference among the circuit lines.

Figure 3A:
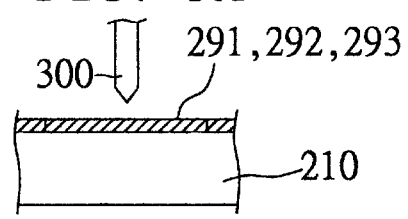
FIGS. 3A–3C are schematic sectional diagrams used to depict the steps used by the method of the invention for breaking integrally-connected electrically-conductive traces apart from each other.
Figure 3B:
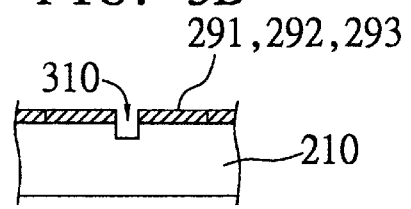
Figure 3C:
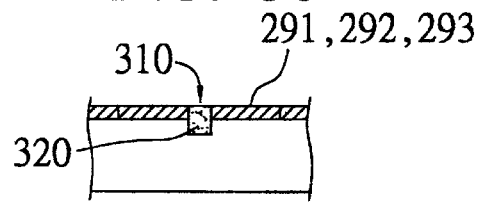

As the plating process is completed, it is then required to break all the electrically-conductive traces 250 apart from the plating bus 280 so as to allow them to serve as individual circuit lines. To achieve this purpose, it is only required to break the first provisional bridging line 291, the second provisional bridging line 292, and the third provisional bridging line 293 into open-circuited state. FIGS. 3A–3C are schematic sectional diagrams used to depict the steps used by the invention for breaking the first provisional bridging line 291, the second provisional bridging line 292, and the third provisional bridging line 293 into open-circuited state.

Referring first to FIG. 3A, in accordance with the invention, a drilling process is performed to drill directly through each of the first provisional bridging line 291, the second provisional bridging line 292, and the third provisional bridging line 293 by means of a driller 300, so as to break all of these provisional bridging lines 291, 292, 293 into open-circuited state.

Referring further to FIG. 3B, the drilling process can proceed until fully penetrating the substrate 210, or until reaching a predetermined depth into the substrate 210 (in the embodiment of FIG. 3B, the drilling process proceeds until reaching a predetermined depth into the substrate 210), so as to break all of these provisional bridging lines 291, 292, 293 into open-circuited state.

As the drilling process is completed, the subsequent step is to use a cutting blade (not shown) to cut all the branched plating lines 281, 282, 283 apart from the plating bus 280, whereby the integrally-connected electrically-conductive traces 250 are separated from each other, allowing them to serve as individual circuit lines.

Referring further to FIG. 3C, through the foregoing drilling process, however, drilled holes 310 are left over the surface of substrate 210, which would make the substrate 210 unsmooth in surface. As a solution, an electrically-insulative material 320, such as solder resist, is filled into each of the drilled holes 310 for the purpose of the substrate surface smoothly flat.

In conclusion, the invention provides a method of fabricating plated circuit lines over BGA substrate. Compared to the prior art, since the invention requires no use of etchant during the drilling process, it would cause no contamination to the substrate surfaces. The utilization of the invention is therefore more environmentally friendly and can make the finished BGA package more assured in quality and reliability. Moreover, the invention allows the use of a reduced layout area for the circuit lines and can help reduce the mutual inductive interference among the circuit lines.

The invention has been described using exemplary preferred embodiments. However, it is to be understood that the scope of the invention is not limited to the disclosed embodiments. On the contrary, it is intended to rover various modifications and similar arrangements. The scope of the claims, therefore, should be accorded the broadest interpretation so as to encompass all such modifications and similar arrangements.

What is claimed is:

1. A method of fabricating a set of plated circuit lines over a BGA substrate, comprising the steps of:

(1) forming a plurality of contact fingers and a plurality of electrically-conductive traces over the substrate's front surface, and a plurality of solder-ball pads over the substrate's back surface; the electrically-conductive traces being respectively connected to each of the contact fingers, while the solder-ball pads are respectively connected over a plurality of electrically-conductive vias to the electrically-conductive traces;

(2) providing at least one plating bus over the substrate;

(3) providing a plurality of provisional bridging lines over the substrate for interconnecting the contact fingers, the electrically-conductive traces, and the solder-ball pads together, and then connecting each integrally-connected group of the contact fingers, the electrically-conductive traces, and the solder-ball pads via a branched plating line to the plating bus;

(4) performing a plating process to plate a selected plating material to the contact fingers and the solder-ball pads, during which a plating electrical current is applied via the plating bus and the branched plating lines to all of the contact fingers and the solder-ball pads; and (5) performing a drilling process to form a drilled hole into each of the provisional bridging lines so as to break all of the provisional bridging lines into open-circuited state.

2. The method of claim 1, further comprising the step of:

(6) filling an electrically-insulative material into each drilled hole.

3. The method of claim 2, wherein in said step (6), the electrically-insulative material is solder resist.

4. The method of claim 1, wherein in said step (4), the plating material is gold.

5. A method of fabricating a set of plated circuit lines over a BGA substrate, comprising the steps of:

(1) forming a plurality of contact fingers and a plurality of electrically-conductive traces over the substrate's front surface, and a plurality of solder-ball pads over the substrate's back surface; the electrically-conductive traces being respectively connected to each of the contact fingers, while the solder-ball pads are respectively connected over a plurality of electrically-conductive vias to the electrically-conductive traces;

(2) providing at least one plating bus over the substrate;

(3) providing a plurality of provision bridging lines over the substrate for interconnecting the contact fingers, the electrically-conductive traces, and the solder-ball pads together, and then connecting each integrally-connected group of the contact fingers, the electrically-conductive traces, and the solder-ball pads via a branched plating line to the plating bus;

(4) performing a plating process to plate a selected plating material to the contact fingers and the solder-ball pads, during which a plating electrical current is applied via the plating bus and the branched plating lines to all of the contact fingers and the solder-ball pads;

(5) performing a drilling process to form a drilled hole into each of the provisional bridging lines so as to break all of the provisional bridging lines into open-circuited state; and (6) filling an electrically-insulative material into each drilled hole.

6. The method of claim 5, wherein in said step (6), the electrically-insulative material is solder resist.

7. The method of claim 5, wherein in said step (4), the plating material is gold.

* * * * *